(12) United States Patent
Baggett et al.

(10) Patent No.: US 9,502,207 B1
(45) Date of Patent: Nov. 22, 2016

(54) CAM ACTUATED FILAMENT CLAMP

(71) Applicant: Axcelis Technologies, Inc., Beverly, MA (US)

(72) Inventors: John F. Baggett, Amesbury, MA (US); Jason R. Beringer, Danvers, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 0 days.

(21) Appl. No.: 14/835,780

(22) Filed: Aug. 26, 2015

(51) Int. Cl.
*H01J 37/20* (2006.01)
*H01J 37/317* (2006.01)
*H01J 37/08* (2006.01)

(52) U.S. Cl.
CPC .......... *H01J 37/08* (2013.01); *H01J 2237/061* (2013.01); *H01J 2237/31701* (2013.01)

(58) Field of Classification Search
CPC ............... H01J 37/3266; H01J 37/165; H01J 37/32091; H01J 37/32541; H01J 37/32568; H01J 37/32651; H01J 37/32699; H01J 37/32844; H01J 2237/002; H01J 2237/327; H01J 37/08; H01J 2337/061; H01J 2237/31701; Y02C 20/30
See application file for complete search history.

(56) References Cited

U.S. PATENT DOCUMENTS 5,886,355 A    3/1999   Bright et al.
7,138,768 B2   11/2006  Maciejowski et al.
7,365,339 B2   4/2008   Fujita et al.
7,586,101 B2   9/2009   Murrell et al.
8,319,410 B2   11/2012  Jerez

*Primary Examiner* — Tracie Y Green
(74) *Attorney, Agent, or Firm* — Eschweller & Associates, LLC

(57) ABSTRACT

An ion source filament clamp has a clamp member having first and second ends. The first end has one of a cam surface and a cam follower, and has first and second portions that are opposed to one another and separated by a slot having a lead opening defined therein to receive a lead of an ion source filament. An actuator pin extends along an actuator pin axis and has first and second sections. The first section is coupled to the first portion of the clamp member. The actuator pin extends through, and is in sliding engagement with, a thru-hole in the second portion of the clamp member. A cam member is operably coupled to the second section of the actuator pin. The cam member has a handle and the other of the cam surface and cam follower and is configured to rotate between a clamped position and an unclamped position. The cam follower slidingly contacts the cam surface. In the clamped position, the cam follower engages the cam surface in a first predetermined manner, thus selectively compressing the first and second portions of the clamp member toward one another and exerting a clamping pressure on the lead within the lead opening while inducing a spring tension between the first and second portions of the clamp member. In the unclamped position, the cam follower engages the cam surface in a second predetermined manner, wherein the spring tension extends the first and second portions of the clamp member apart from one another, therein releasing the clamping pressure on the lead within the lead opening.

20 Claims, 6 Drawing Sheets

CAM ACTUATED FILAMENT CLAMP

TECHNICAL FIELD

The present invention relates generally to ion implantation systems, and more specifically to an apparatus for selectively clamping a filament in an ion source cathode assembly.

BACKGROUND

Ion implantation systems are widely used in semiconductor processing to diffuse or implant positive ions onto regions of a semiconductor workpiece. Typically, an ion source generates an ion beam that is used to implant the semiconductor workpiece. The ion source typically comprises an indirectly heated cathode assembly having a filament for heating the cathode.

A conventional ion source having an indirectly-heated cathode typically comprises an arc chamber (also called a plasma chamber), cathode assembly, filament, insulator block, graphite support plate, and a filament clamp assembly, wherein the filament is positioned within a cavity defined by the cathode. The cathode is heated by an electron bombardment from the filament, whereby the cathode emits electrons thermionically within the arc chamber. Assembly and position of the filament with respect to the cathode directly relates to performance, efficiency, and life expectancy of the ion source.

A typical filament employed in an ion implantation system cathode assembly comprises two leads with a filament loop extending between the leads. The leads are typically individually held in place by respective filament clamps, whereby clamping jaws of the filament clamp are tightened around the leads via a pair of screws threaded into a hole in the respective filament clamp. Due, at least in part, to the extreme high temperatures in the ion source, material from the filament can deposit on the threads of the screws, thus making the threading of the screws into the holes difficult. Similarly, galling of the threads can occur, which can lead to welding together of the threads, thus losing the ability to tighten or loosen the clamp to the leads. Further, the high temperatures involved in the ion source can lead to stresses within the cold-formed screws to relax, thus further worsening the ability to adequately clamp the filament leads and provide proper electrical connection thereto. When the electrical connection to the filament is compromised or the filament clamps can no longer perform adequately, repair or replacement of the clamps is typically necessary, thus resulting in increased maintenance costs and downtime for the ion implantation system.

SUMMARY

The present disclosure provides a robust filament clamp for an ion source, wherein the filament clamp is configured to receive and clamp a lead of a filament for the ion source. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Thus, in accordance with the present disclosure, an ion source filament clamp is provided, wherein the filament clamp comprises a clamp member having a first end and a second end. The first end of the clamp member comprises one of a cam surface and a cam follower, wherein the first end has first and second portions that are opposed to one another and separated by a slot. A lead opening is further defined in the slot, wherein the lead opening is configured to receive a lead of an ion source filament.

An actuator pin extends along an actuator pin axis and has a first section and a second section associated therewith, wherein the first section of the actuator pin is coupled to the first portion of the clamp member. The actuator pin further extends through a thru-hole in the second portion of the clamp member and is in sliding engagement with the thru-hole.

A cam member is further operably coupled to the second section of the actuator pin, wherein the cam member comprises a handle and the other of the cam surface and cam follower. The cam member is configured to rotate between a clamped position and an unclamped position. The cam follower is configured to slidingly contact the cam surface, wherein in the clamped position, the cam follower is configured to engage the cam surface in a first predetermined manner, and wherein in the unclamped position, the cam follower is configured to engage the cam surface in a second predetermined manner. In the clamped position, the first and second portions of the clamp member are forced toward one another, therein exerting a clamping pressure on the lead within the lead opening. In the unclamped position, the first and second portions of the clamp member are forced apart from one another, therein releasing the clamping pressure on the lead within the lead opening. One of the first predetermined manner and second predetermined manner, for example, comprises inducing a spring tension between the first and second portions of the clamp member. Accordingly, the other of the first predetermined manner and second predetermined manner comprises releasing the spring tension between the first and second portions of the clamp member.

In one example, the first predetermined manner comprises compressing the first and second portions of the clamp member toward one another and exerting a clamping pressure on the lead within the lead opening while inducing a spring tension between the first and second portions of the clamp member. In the second predetermined manner, for example, the spring tension extends the first and second portions of the clamp member apart from one another, therein releasing the clamping pressure on the lead within the lead opening.

In accordance with one exemplary aspect, the actuator pin comprises a connection hole extending radially through the second section of the actuator pin. The cam member is thus operably coupled to the actuator pin along a connection axis via a connection pin extending through the connection hole.

In one example, the cam member is rotationally coupled to the actuator pin via the connection pin, wherein the first predetermined manner in which the cam follower engages the cam surface is a rotational sliding engagement about the connection axis. The cam member, for example, comprises the cam surface wherein the first end of the clamp member defines the cam follower. In such an example, the cam surface can be defined by a radiused portion of the cam member opposite the handle, wherein the radiused portion of the cam member is radiused about the connection axis.

In another example, the cam member is fixedly coupled to the actuator pin, such as via the connection pin, wherein the first predetermined manner in which the cam follower engages the cam surface is a rotational sliding engagement about the actuator pin axis. In such an example, the cam member can comprise the cam follower and the first end of the clamp member can define the cam surface. For example, the cam surface can comprise a wedge defined on the first end of the clamp member, wherein the first predetermined manner in which the cam follower engages the cam surface is a rotational sliding engagement of the cam follower along an angled portion of the wedge upon rotation of the cam member about the actuator pin axis.

In yet another example, the cam member is fixedly coupled to the actuator pin via the connection pin, wherein the cam follower is defined by a follower pin extending radially from the actuator pin. As such, the cam surface can be defined by a cam slot defined in a sidewall of the first end of the clamp member, wherein the first predetermined manner in which the cam follower engages the cam surface is a sliding engagement between the cam follower and cam slot upon rotation of the actuator pin about the actuator pin axis.

The second end of the clamp member, for example, can further comprise a mounting region configured to mount to an ion source chamber. The clamp member, for example, may comprise a heat treated metal configured to provide a predetermined spring constant.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1A:
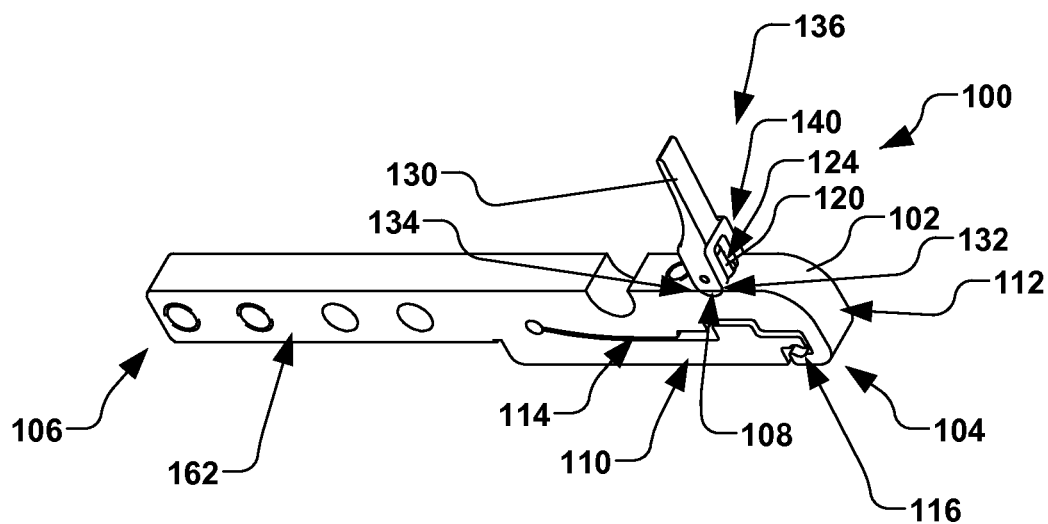
FIG. 1A is a perspective view of an exemplary filament clamp for an ion source in a clamped position in accordance with several aspects of the present disclosure.

The present disclosure is directed generally toward a system, apparatus, and method for clamping an electrode of an ion source. Accordingly, the present invention will now be described with reference to the drawings, wherein like reference numerals may be used to refer to like elements throughout. It will be understood that the description provided herein is merely illustrative and that this detailed description should not be interpreted in a limiting sense. In the following description, for purposes of explanation, numerous specific details are set forth in order to provide a thorough understanding of the present invention. It will be evident to one skilled in the art, however, that the present invention may be practiced without certain of these specific details. Further, the scope of the invention is not intended to be limited by the embodiments or examples described hereinafter with reference to the accompanying drawings, but is intended to be only limited by the appended claims and substantial equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented via wireless communication, unless noted to the contrary.

In accordance with one aspect of the present disclosure, FIGS. 1A-1E illustrate an exemplary filament clamp 100 for an ion source (not shown), wherein the filament clamp is configured to selectively retain a lead of an ion source filament. The filament clamp 100, for example, comprises a clamp member 102 having a first end 104 and a second end 106. The filament clamp 100 further comprises a cam member 108 operably coupled to the clamp member 102. The first end 104 of the clamp member 102, for example, has a first portion 110 and a second portion 112 that are opposed to one another and generally separated by a slot 114. A lead opening 116 is further defined in the slot 114, wherein the lead opening is configured to receive a lead of an ion source filament (not shown).

Figure 1B:
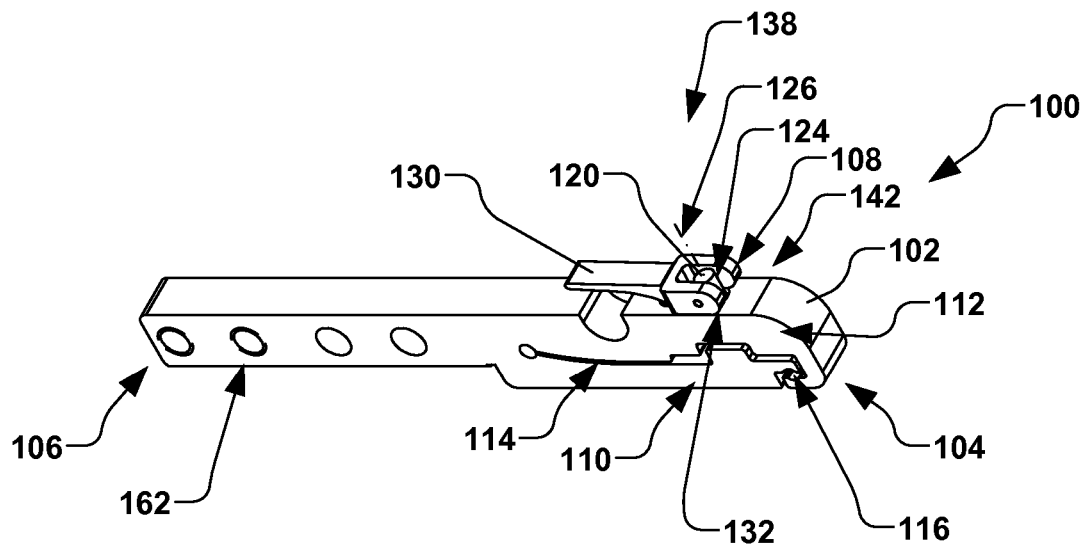
FIG. 1B is a perspective view of the exemplary filament clamp of FIG. 1A in an unclamped position in accordance with further aspects of the present disclosure.
Figure 1C:
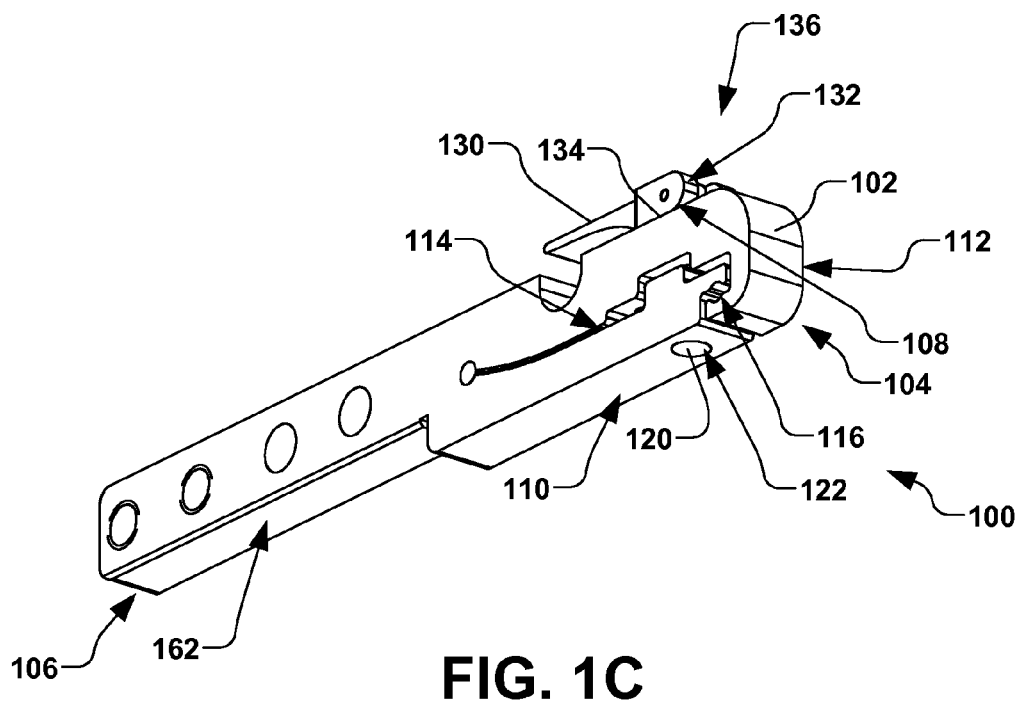
FIG. 1C is another perspective view of the filament clamp of FIGS. 1A-1B in an unclamped position in accordance with further aspects of the present disclosure.
Figure 1D:
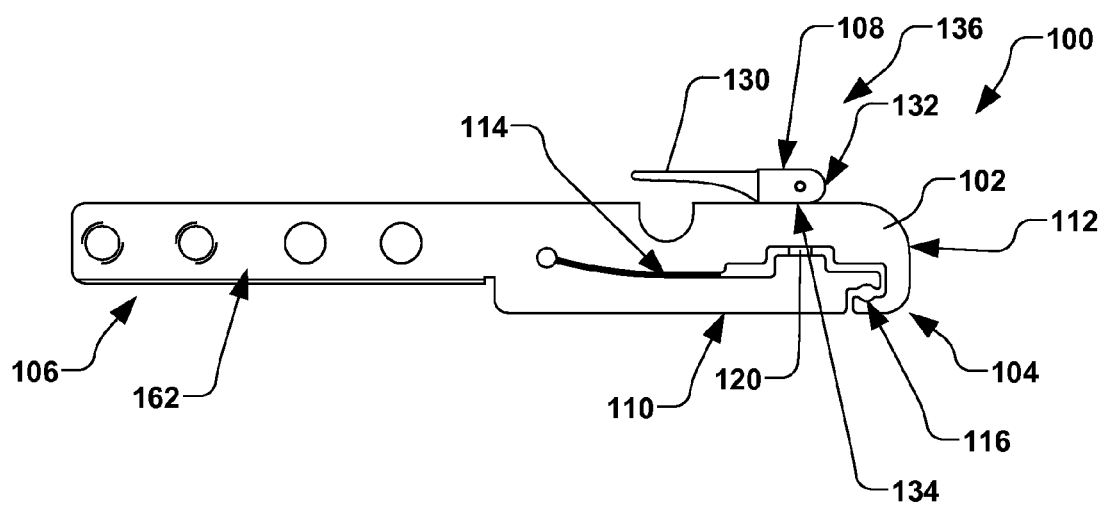
FIG. 1D is side view of the filament clamp of FIGS. 1A-1C in the unclamped position in accordance with further aspects of the present disclosure.
Figure 1E:
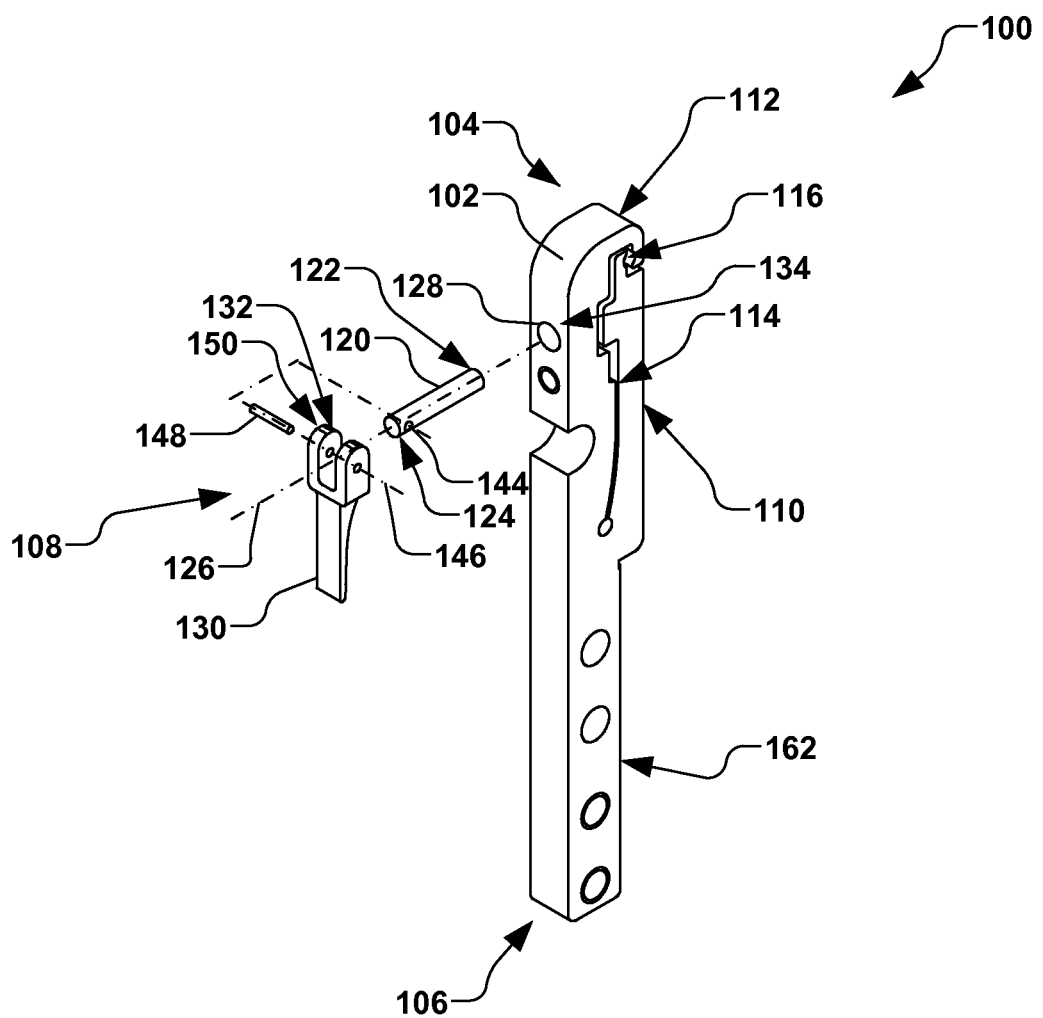
FIG. 1E is an exploded perspective view of the filament clamp of FIGS. 1A-1D in accordance with additional aspects of the present disclosure.

An actuator pin 120 is further provided having a first section 122 and a second section 124, wherein the actuator pin generally extends along an actuator pin axis 126, as illustrated in FIG. 1E. In the present example, the first section 122 of the actuator pin 120 is coupled to the first portion 110 of the clamp member 102, and is generally fixed along the actuator pin axis with respect to the first section of the actuator pin. The actuator pin 120 further extends through a thru-hole 128 in the second portion 112 of the clamp member 102 and is in sliding engagement with the thru-hole. The actuator pin 120 may be configured to rotate about the actuator pin axis 126, whereby the first section 122 of the actuator pin may comprise a boss (not shown) configured to reside in a pocket (not shown) of the clamp member 102.

The cam member 108 in the present example is operably coupled to the second section 124 of the actuator pin 120, wherein the cam member comprises a handle 130 and one of a cam surface 132 and a cam follower 134. In the present example illustrated in FIGS. 1A-1E, the first end 104 of the clamp member 102 comprises the cam follower 134, while the cam member 108 comprises the cam surface 132 defined thereon, although other variations are also considered. For example, while the cam surface 132 is shown as being integral to the cam member 108 in the present example, other configurations are also possible, such as the cam surface being a member (not shown) attached to or otherwise coupled to the cam member 108 or clamp member 102, and the cam follower 134 may be similarly integral with or operably coupled to the respective clamp member and cam member, and all such variations are considered to fall within the scope of the present disclosure. Thus, it should be noted that the clamp member 102 and cam member 108 may respectively comprise the cam follower 134 and cam surface 132, as illustrated in FIGS. 1A-1E, or the cam surface and cam follower may be interchanged between the clamp member and cam member. It is to be understood that the present disclosure contemplates any such arrangement of the cam follower 134 and cam surface 132.

The cam member 108, for example, is configured to rotate between a clamped position 136 shown in FIG. 1A and an unclamped position 138 shown in FIG. 1B. The cam follower 134, for example, is configured to slidingly contact the cam surface 132, wherein in the clamped position 136 of FIG. 1A, the cam follower engages the cam surface in a first predetermined manner 140. In the present example, in the first predetermined manner 140, the first portion 110 and second portion 112 of the first end 104 of the clamp member 102 are compressed toward one another, thus exerting a clamping pressure on the lead (not shown) within the lead opening 116, while concurrently inducing a spring tension between the first and second portions of the first end of the clamp member. In the unclamped position 138 of FIG. 1B, for example, the cam follower 134 engages the cam surface 132 in a second predetermined manner 142, wherein the spring tension extends the first portion 110 and second portion 112 of the first end 104 of the clamp member 102 apart from one another, therein releasing the clamping pressure on the lead within the lead opening 116.

In accordance with one exemplary aspect, as illustrated in FIG. 1E, the actuator pin 120 comprises a connection hole 144 extending radially through the second section 124 of the actuator pin. The cam member 108, for example, is thus operably coupled to the actuator pin 120 along a connection axis 146 via a connection pin 148 extending through the connection hole 144.

In the present example of FIGS. 1A-1E, the cam member 108 is rotationally coupled to the actuator pin 120 via the connection pin 148, wherein the first predetermined manner 140 of FIG. 1A in which the cam follower 134 engages the cam surface 132 is a rotational sliding engagement of the cam surface about the connection axis 146. The cam member 108, for example, comprises the cam surface 132 wherein the first end 104 of the clamp member 102 defines the cam follower 134. In such an example, the cam surface 132 can be defined by a radiused portion 150 of the cam member 108 opposite (or integral to) the handle 130, as illustrated in FIG. 1E, wherein the radiused portion of the cam member is radiused about the connection axis 146.

Figure 2A:
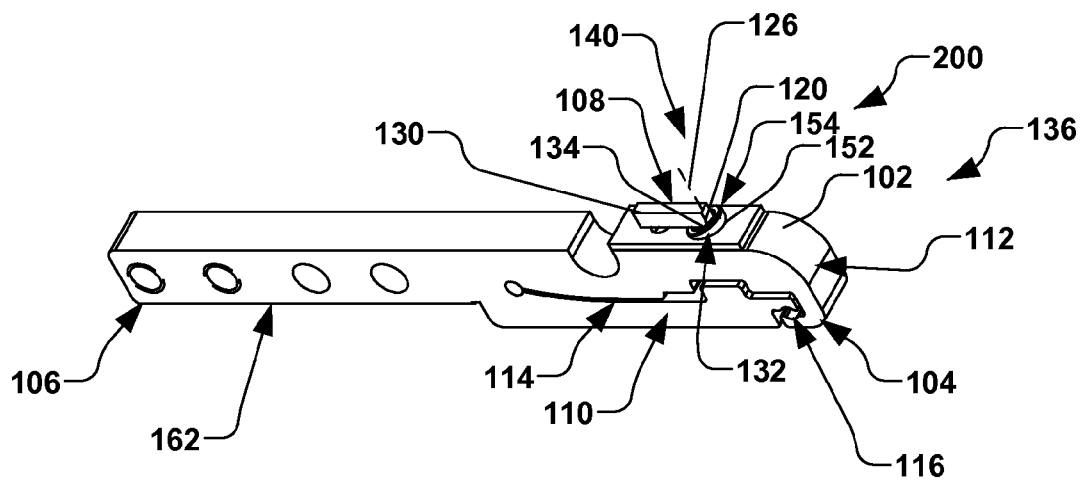
FIG. 2A is a perspective view of another exemplary filament clamp for an ion source in a clamped position in accordance with several aspects of the present disclosure.
Figure 2B:
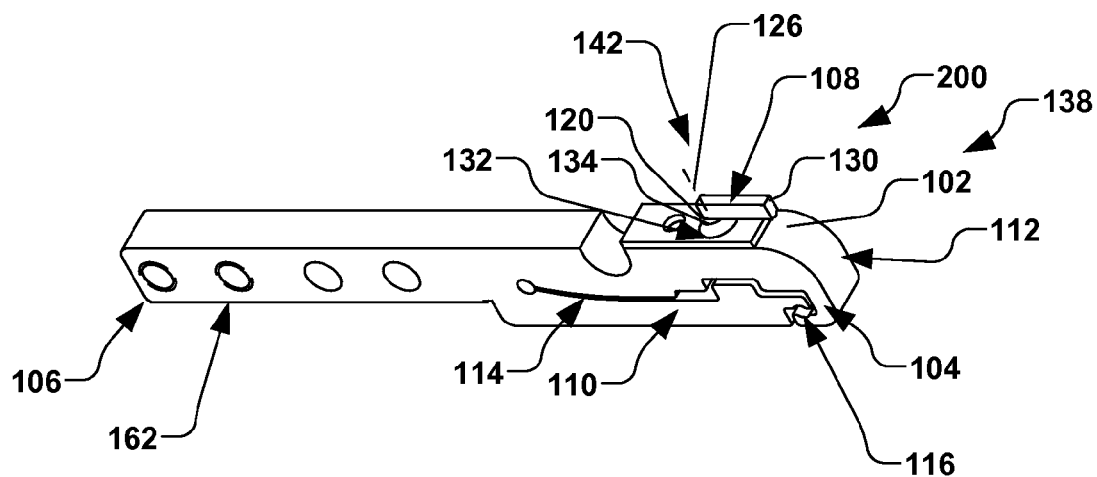
FIG. 2B is a perspective view of the exemplary filament clamp of FIG. 2A in an unclamped position in accordance with further aspects of the present disclosure.

In another example, as illustrated in FIGS. 2A-2B, another exemplary filament clamp 200 is illustrated, wherein the cam member 108 is fixedly coupled to the actuator pin 120 (e.g., via the connection pin—not shown), wherein the first predetermined manner 140 in which the cam follower 134 engages the cam surface 132 is a rotational sliding engagement about the actuator pin axis 126 of FIG. 2A, therein placing the filament claim in the clamped position 136. In such an example, the cam member 108 can comprise the cam follower 134 and the first end 104 of the clamp member 102 can define the cam surface 132. For example, the cam surface 132 can comprise a wedge 152 defined on the first end 104 of the clamp member 102, wherein the first predetermined manner 140 in which the cam follower 134 engages the cam surface is a rotational sliding engagement of the cam follower along an angled portion 154 of the wedge upon rotation of the cam member 108 about the actuator pin axis 126. FIG. 2B, for example, illustrates the second predetermined manner 142 in which the cam follower 134 engages the cam surface 132, therein placing the filament clamp 200 in the unclamped position 138.

Figure 3A:
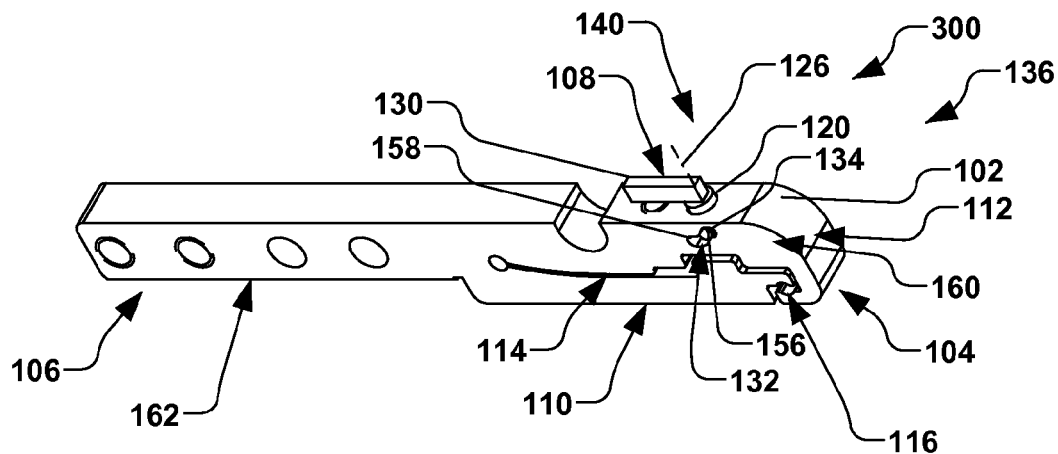
FIG. 3A is a perspective view of yet another exemplary filament clamp for an ion source in a clamped position in accordance with several aspects of the present disclosure.
Figure 3B:
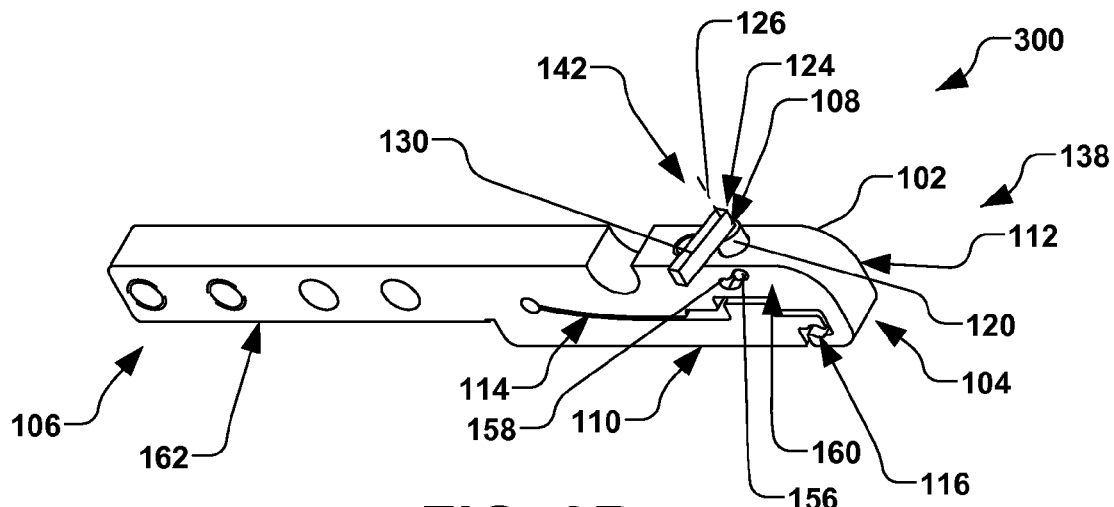
FIG. 3B is a perspective view of the exemplary filament clamp of FIG. 3A in an unclamped position in accordance with further aspects of the present disclosure.

In yet another example, as illustrated in FIGS. 3A-3B, yet another exemplary filament clamp 300 is provided, wherein the cam member 108 is fixedly coupled to the actuator pin 120 (e.g., via the connection pin—not shown), and wherein the cam follower 134 is defined by a follower pin 156 extending radially from the actuator pin 120. As such, the cam surface 132 can be defined by a cam slot 158 defined in a sidewall 160 of the first end 104 of the clamp member 102, wherein the first predetermined manner 140 in which the cam follower 134 engages the cam surface is a sliding engagement between the cam follower and the cam slot upon rotation of the actuator pin 120 about the actuator pin axis 126.

Figure 4A:
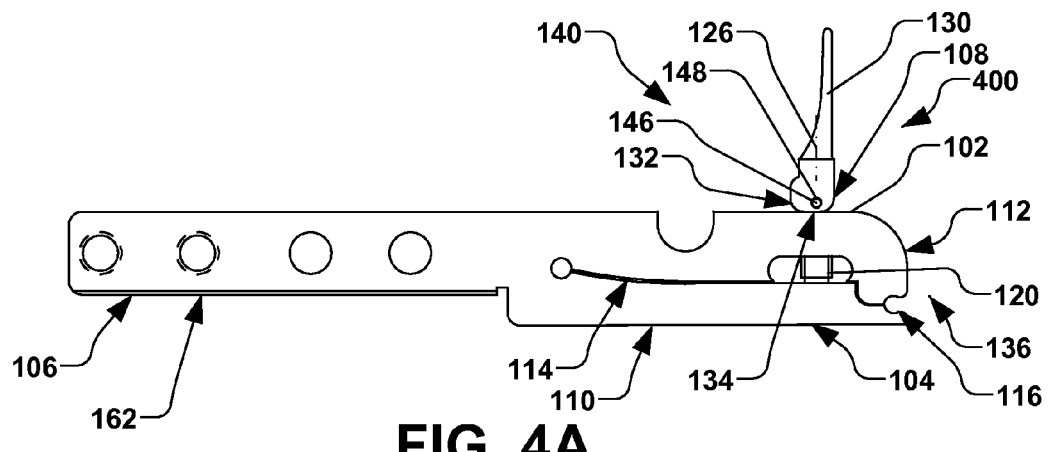
FIG. 4A is a side view of still another exemplary filament clamp for an ion source in a clamped position in accordance with several aspects of the present disclosure.
Figure 4B:
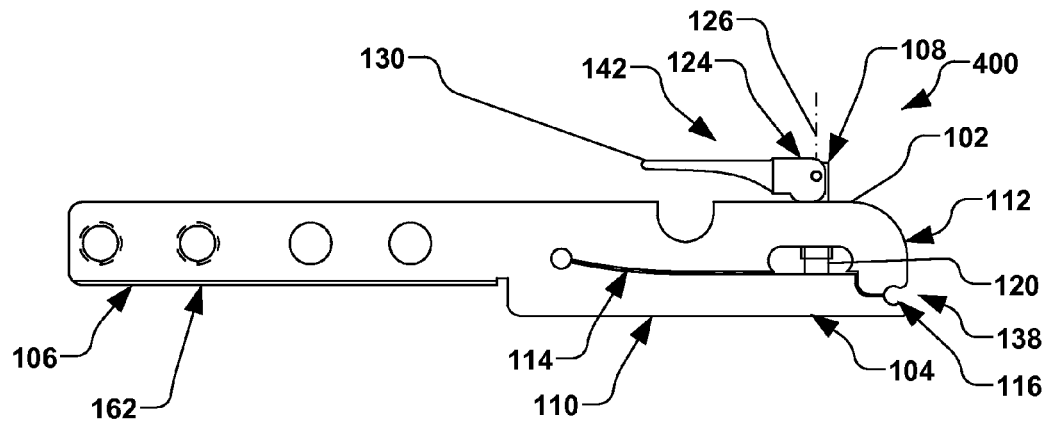
FIG. 4B is a side view of the exemplary filament clamp of FIG. 4A in the unclamped position in accordance with further aspects of the present disclosure.
Figure 4C:
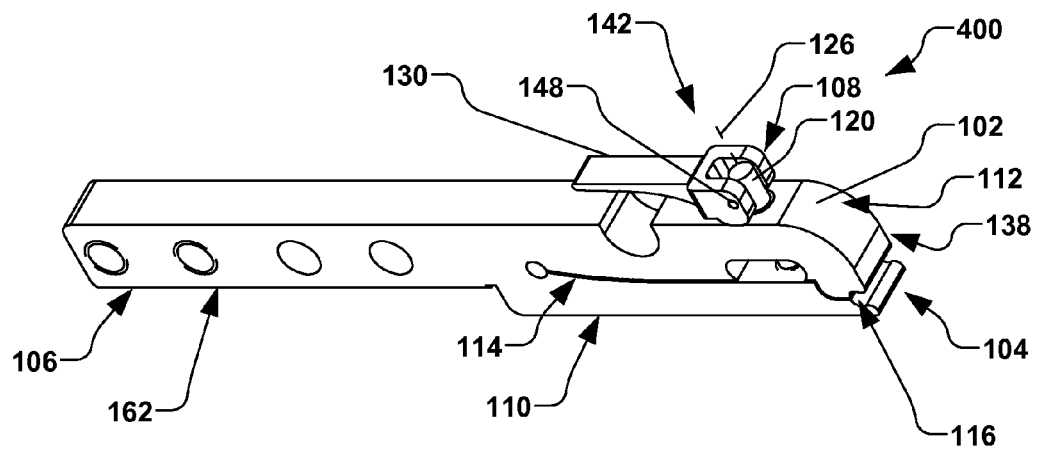
FIG. 4C is a perspective view of the exemplary filament clamp of FIGS. 4A-4B in the unclamped position in accordance with further aspects of the present disclosure.

In another example, as illustrated in FIGS. 4A-4C, still another exemplary filament clamp 400 is provided, wherein the cam member 108 is coupled to the actuator pin 120 via the connection pin 148, and wherein the first predetermined manner 140 of FIG. 4A in which the cam follower 134 engages the cam surface 132 is a rotational sliding engagement of the cam surface about the connection axis 146. In the present example, the cam member 108 comprises the cam surface 132 wherein the first end 104 of the clamp member 102 defines the cam follower 134. As shown in FIG. 4A, the first predetermined manner 140 in which the cam follower 134 engages the cam surface 132 is where spring tension between the first portion 110 and second portion 112 of the clamp member 102 is generally released therein forcing the first portion 110 and second portion 112 of the clamp member 102 toward the clamped position 136.

As illustrated in FIGS. 4B and 4C, the second predetermined manner in which the cam follower 134 engages the cam surface 132 is illustrated, wherein the spring tension between the first portion 110 and second portion 112 of the clamp member 102 is generally induced therein forcing the first portion 110 and second portion 112 of the clamp member 102 apart to the unclamped position 138.

While several examples are illustrated in FIGS. 1A-1E, 2A-2B, 3A-3B, and 4A-4B, it should be noted that the cam member 108 may and configuration of the clamp member 102 may take various other forms, whereby one of the first predetermined manner and second predetermined manner in which the cam follower 134 engages the cam surface 132 defines one of the unclamped position 138 and clamped position 136, and the other of the first predetermined manner and second predetermined manner define the other one of the unclamped position and clamped position, and any such configuration is contemplated as falling within the scope of the present disclosure.

Furthermore, in accordance with another example, as illustrated in FIGS. 1A-1E, 2A-2B, 3A-3B, and 4A-4B the second end 106 of the clamp member 102 can further comprise a mounting region 162 configured to mount to an ion source chamber (not shown) or one or more components thereof. Furthermore, the clamp member 102, for example, may be comprised of a heat treated metal configured to provide a predetermined spring constant.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source filament clamp, comprising:
a clamp member having a first end and a second end, wherein the first end comprises one of a cam surface and a cam follower, and wherein the clamp member comprises first and second portions associated with the first end thereof that are opposed to one another and separated by a slot, wherein a lead opening is further defined in the slot and configured to receive a lead of an ion source filament;
an actuator pin extending along an actuator pin axis, wherein a first section of the actuator pin is coupled to the first portion of the clamp member, and wherein the actuator pin extends through a thru-hole in the second portion of the clamp member and is in sliding engagement with the thru-hole; and
a cam member operably coupled to a second section of the actuator pin, wherein the cam member comprises a handle and the other of the cam surface and cam follower, wherein the cam member is configured to rotate between a clamped position and an unclamped position, wherein the cam follower is configured to slidingly contact the cam surface, and wherein in the clamped position, the cam follower is configured to engage the cam surface in a first predetermined manner, and wherein in the unclamped position, the cam follower is configured to engage the cam surface in a second predetermined manner, wherein in the clamped position, the first and second portions of the clamp member are forced toward one another, therein exerting a clamping pressure on the lead within the lead opening, and wherein in the unclamped position, the first and second portions of the clamp member are forced apart from one another, therein releasing the clamping pressure on the lead within the lead opening, wherein one of the first predetermined manner and second predetermined manner comprises inducing a spring tension between the first and second portions of the clamp member, and wherein the other of the first predetermined manner and second predetermined manner comprises releasing the spring tension between the first and second portions of the clamp member.

2. The ion source filament clamp of claim 1, wherein the actuator pin comprises a connection hole extending radially through the second section of the actuator pin, and wherein the cam member is operably coupled to the actuator pin along a connection axis via a connection pin extending through the connection hole.

3. The ion source filament clamp of claim 2, wherein the cam member is rotationally coupled to the actuator pin via the connection pin, and wherein the first predetermined manner in which the cam follower engages the cam surface is a rotational sliding engagement about the connection axis.

4. The ion source filament clamp of claim 3, wherein the cam member comprises the cam surface and the first end of the clamp member defines the cam follower.

5. The ion source filament clamp of claim 4, wherein the cam surface is defined by a radiused portion of the cam member opposite the handle.

6. The ion source filament clamp of claim 5, wherein the radiused portion of the cam member is radiused about the connection axis.

7. The ion source filament clamp of claim 2, wherein the cam member is fixedly coupled to the actuator pin via the connection pin, and wherein the first predetermined manner in which the cam follower engages the cam surface is a rotational sliding engagement about the actuator pin axis.

8. The ion source filament clamp of claim 7, wherein the cam member comprises the cam follower and the first end of the clamp member defines the cam surface.

9. The ion source filament clamp of claim 8, wherein the cam surface comprises a wedge defined on the first end of the clamp member, wherein the first predetermined manner in which the cam follower engages the cam surface is a rotational sliding engagement of the cam follower along an angled portion of the wedge upon rotation of the cam member about the actuator pin axis.

10. The ion source filament clamp of claim 2, wherein the cam member is fixedly coupled to the actuator pin via the connection pin, and wherein the cam follower is defined by a follower pin extending radially from the actuator pin, and wherein the cam surface is defined by a cam slot defined in a sidewall of the first end of the clamp member, wherein the first predetermined manner in which the cam follower engages the cam surface is a sliding engagement between the cam follower and cam slot upon rotation of the actuator pin about the actuator pin axis.

11. The ion source filament clamp of claim 2, wherein the second end of the clamp member comprises a mounting region configured to mount to an ion source chamber.

12. The ion source filament clamp of claim 2, wherein the clamp member comprises a heat treated metal configured to provide a predetermined spring constant.

13. An ion source filament clamp, comprising:
a clamp member having a first end and a second end, wherein the first end comprises one of a cam surface and a cam follower, and wherein the first end has first and second portions that are opposed to one another and separated by a slot, wherein a lead opening is further defined in the slot and configured to receive a lead of an ion source filament;
an actuator pin extending along an actuator pin axis, wherein a first section of the actuator pin is coupled to the first portion of the clamp member, and wherein the actuator pin extends through a thru-hole in the second portion of the clamp member and is in sliding engagement with the thru-hole; and
a cam member operably coupled to a second section of the actuator pin, wherein the cam member comprises a handle and the other of the cam surface and cam follower, wherein the cam member is configured to rotate between a clamped position and an unclamped position, wherein the cam follower is configured to slidingly contact the cam surface, and wherein in the clamped position, the cam follower engages the cam surface in a first predetermined manner, and wherein in the unclamped position, the cam follower engages the cam surface in a second predetermined manner, wherein one of the first predetermined manner and second predetermined manner compresses the first and second portions of the clamp member toward one another and exerts a clamping pressure on the lead within the lead opening while inducing a spring tension between the first and second portions of the clamp, and wherein the spring tension extends the first and second portions of the clamp member apart from one another, therein releasing the clamping pressure on the lead within the lead opening.

14. The ion source filament clamp of claim 13, wherein the actuator pin comprises a connection hole extending radially through the second section of the actuator pin, and wherein the cam member is operably coupled to the actuator pin along a connection axis via a connection pin extending through the connection hole.

15. The ion source filament clamp of claim 14, wherein the cam member is rotationally coupled to the actuator pin via the connection pin, and wherein the first predetermined manner in which the cam follower engages the cam surface is a rotational sliding engagement about the connection axis.

16. The ion source filament clamp of claim 15, wherein the cam member comprises the cam surface and the first end of the clamp member defines the cam follower.

17. The ion source filament clamp of claim 16, wherein the cam surface is defined by a radiused portion of the cam member opposite the handle.

18. The ion source filament clamp of claim 14, wherein the cam member is fixedly coupled to the actuator pin via the connection pin, and wherein the first predetermined manner in which the cam follower engages the cam surface is a rotational sliding engagement about the actuator pin axis.

19. The ion source filament clamp of claim 18, wherein the cam member comprises the cam follower and the first end of the clamp member defines the cam surface.

20. The ion source filament clamp of claim 19, wherein the cam surface comprises a wedge defined on the first end of the clamp member, wherein the first predetermined manner in which the cam follower engages the cam surface is a rotational sliding engagement of the cam follower along an angled portion of the wedge upon rotation of the cam member about the actuator pin axis.

* * * * *